(12) United States Patent
Matsumoto

(10) Patent No.: US 6,462,383 B1
(45) Date of Patent: Oct. 8, 2002

(54) SEMICONDUCTOR DEVICE WITH EMBEDDED PROTECTION ELEMENT

(75) Inventor: Naoya Matsumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/487,242

(22) Filed: Jan. 20, 2000

(30) Foreign Application Priority Data

Jan. 20, 1999 (JP) ............................................. 11-011888

(51) Int. Cl.⁷ ................................................ H01L 23/62
(52) U.S. Cl. ........................ 257/360; 257/173; 257/355; 257/328
(58) Field of Search ................................. 257/173, 328, 257/360, 355

(56) References Cited

U.S. PATENT DOCUMENTS

| | | | | | |
|---|---|---|---|---|---|
| 4,616,243 A | * | 10/1986 | Minato et al. | ............ | 357/23.13 |
| 4,862,233 A | * | 8/1989 | Matsushita et al. | ......... | 357/23.4 |
| 5,079,613 A | * | 1/1992 | Sawada et al. | ................ | 357/42 |
| 5,119,162 A | * | 6/1992 | Todd et al. | .................... | 357/43 |
| 5,162,966 A | * | 11/1992 | Fujihira | ...................... | 257/140 |
| 5,268,587 A | * | 12/1993 | Murata et al. | ............... | 257/357 |
| 5,514,893 A | * | 5/1996 | Miyanaga et al. | .......... | 257/360 |
| 5,729,044 A | * | 3/1998 | Mille et al. | .................. | 257/603 |
| 5,851,864 A | * | 12/1998 | Ito et al. | ..................... | 438/203 |
| 5,903,028 A | * | 5/1999 | Quoirin et al. | ............. | 257/328 |
| 6,049,096 A | * | 4/2000 | Bernier | ........................ | 257/173 |
| 6,208,010 B1 | * | 3/2001 | Nakazato et al. | ........... | 257/544 |
| 6,266,222 B1 | * | 7/2001 | Colombo et al. | ........... | 361/111 |

FOREIGN PATENT DOCUMENTS

| | | | |
|---|---|---|---|
| JP | 4-22163 | | 1/1992 |
| JP | 2000156422 | * | 6/2000 |

* cited by examiner

Primary Examiner—Eddie Lee
Assistant Examiner—Eugene Lee
(74) Attorney, Agent, or Firm—Young & Thompson

(57) ABSTRACT

A semiconductor device includes an internal element and a protection element for protecting the internal element from entering static electricity. The both elements have the respective embedded layers, and the embedded layer of the internal element has a larger electric resistance than the embedded layer of the protection element. When unnecessary current flows in the semiconductor device, the current is discharged through the protection element and the internal element is protected.

15 Claims, 7 Drawing Sheets

FIG. 4
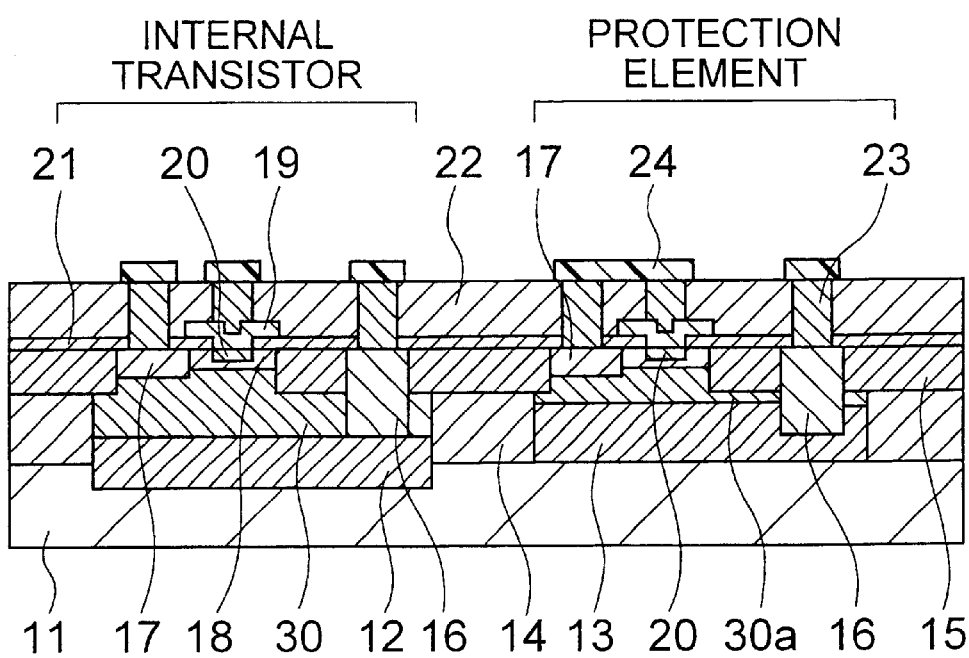
FIG. 5A
FIG. 5B
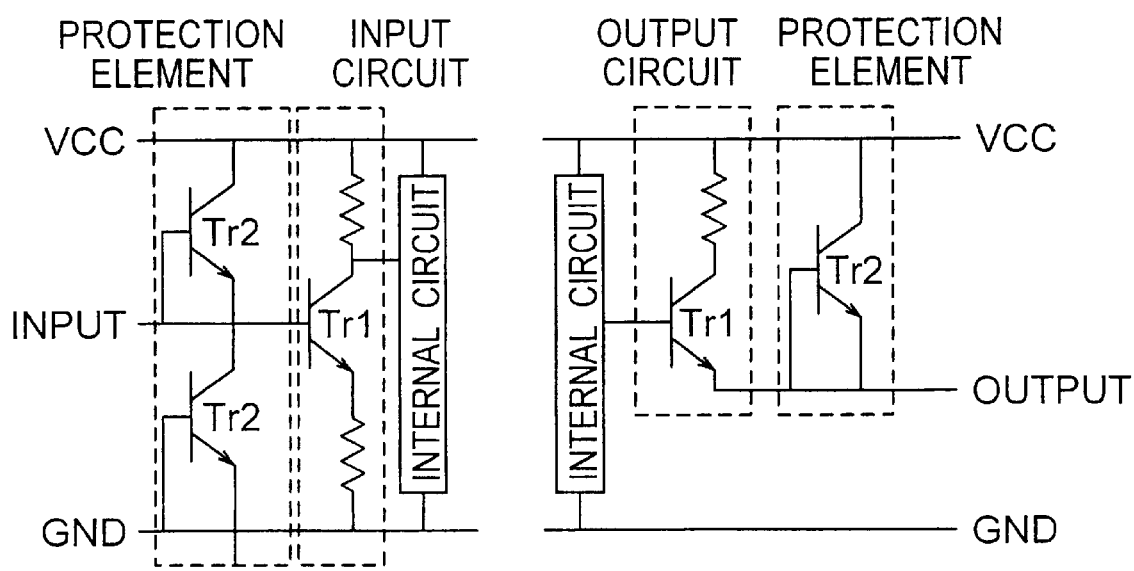

11  42          16                    16  15  41

11        30  12   14   13    30  16  15  41

11  17  18  30  12  14  13      30 16  15  21

11  17  18  30  12  14  13  20  30 16  15

SEMICONDUCTOR DEVICE WITH EMBEDDED PROTECTION ELEMENT

BACKGROUND OF THE INVENTION (a) Field of the Invention

The present invention relates to a semiconductor device for securely protecting its internal element from static electricity and a method for manufacturing the same, and more in detail to the semiconductor device including the internal element and a protection element in which electrostatic energy is discharged through the protection element for protecting the internal element and the method for manufacturing the same.

(b) Description of the Related Art

In a conventional semiconductor device, protection elements are generally connected to input and output terminals for protecting an internal element against electrostatic breakdown. That is, electrostatic energy is discharged through the protection circuit toward a grounded line (GND) or a power source line VCC) for protecting the internal element before entering the internal element.

Especially, in a bipolar transistor device, the decrease of a parasitic capacitance is essential for a high-speed operation to thereby make a collectors base junction and a base-emitter junction shallower. When the static electricity enters the internal element (bipolar transistor), electrostatic breakdown is likely to occur due to concentration of an electric field. Accordingly, high-performance protection elements have been proposed heretofore.

JP-A-4(1992)-22163 describes a semiconductor device including a conventional protection element. An example of a circuit construction of the conventional semiconductor device (first conventional example) is shown in FIG. 1 and a vertical cross section of the semiconductor device is shown in FIG. 2. The first conventional example employs a reverse discharge as well as a forward discharge of a P-N junction by using a breakdown phenomenon of the P-N junction.

As shown in FIG. 1, the emitter and the base of a bipolar transistor are connected and base current starts to flow when a breakdown voltage is applied between the base and the collector by entering static electricity in the first conventional example. The bipolar transistor is driven for operation by the breakdown current flowing through the base resistance as a trigger. Due to the amplification factor (hfe) of the bipolar transistor as high as to 50 to 150, the discharge path is switched from the base-collector path to the collector-emitter path by the function of the transistor. The bipolar operation completes the discharge at a moment for effectively acting as the protection element. Since a plenty of current flows at a moment, the size of the protection element is required to be larger than the internal transistor for preventing the destruction of the protection element itself.

As shown in FIG. 2, the conventional semiconductor device includes an N-type epitaxial layer 102 overlying a P-type silicon substrate 101, and an N-type embedded layer 103 between the P-type silicon substrate 101 and the N-type epitaxial layer 102. The N-type epitaxial layer 102 on the N-type embedded layer 103 functions as the intrinsic collector region of the bipolar transistor.

A field oxide film 110 is formed by selectively replacing the region other than a diffused region with an oxide film. A P-type dielectric layer 104 underlying the field oxide film 110 functions as an isolation layer for surrounding the side surface of the transistor and has a depth reaching to the surface of the silicon substrate 101.

A base layer 105 is formed as a P-type layer overlying the N-type embedded layer 103, and an N-type emitter layer 106 is formed in the base layer 105.

A heavily doped N-type collector layer 107 is formed between a collector electrode 111 and the N-type embedded layer 103, and a voltage is applied to the N-type embedded layer 103 through the N-type collector layer 107.

A silicon oxide film 108 functions as a dielectric film covering the N-type epitaxial layer 102, and the respective via holes are formed in the silicon oxide film 108 corresponding to the base layer 105, the N-type emitter layer 106 and the N-type collector layer 107.

An aluminum electrode 109 is disposed on the via holes to connect a base electrode and an emitter electrode.

In the bipolar transistor as the protection element in the conventional example 1, the breakdown voltage is determined by a base-collector breakdown voltage which is not largely different from that of the internal transistor (the transistors of the protection element and the internal element have substantially the same structure).

The selective discharge is generally designed to occur by employing the protection element having a long discharge path (or a large size). However, when the base-collector breakdown voltage of the internal transistor becomes lower than that of the protection element due to variation of manufacturing conditions, the discharge of the internal transistor starts earlier than that of the protection element, and the internal transistor is disadvantageously destroyed.

A circuit diagram of a second conventional example which achieves the improvement of the above disadvantage is shown in FIG. 3. A sectional view of a semiconductor in FIG. 3 corresponding to FIG. 2 is omitted because only electrodes to be connected are modified.

In the circuit shown in FIG. 3, the collector and the emitter are reversed from an ordinary circuit, wherein and the collector and the base are connected. A voltage is applied between the emitter and the base, and when a breakdown starts therebetween, a reverse operation of the bipolar transistor is triggered by the breakdown current flowing through a base resistance. Since its amplification factor (reverse hfe) is about 1 which is not high, the current flowing in the discharge path is divided into the breakdown current and the current flowing between the emitter and the collector. The division of the current in the second conventional example shown in FIG. 3 more rapidly completes the discharge.

Further, since the emitter-base breakdown voltage of the protection element is less than half the base-collector breakdown voltage of the internal transistor, the first discharge advantageously starts in the protection element.

However, the reduction of the thickness of the emitter layer in the second conventional example for a high-speed operation increases the density of the breakdown current flowing between the emitter electrode and the base electrode, thereby causing a destruction.

SUMMARY OF THE INVENTION

In view of the foregoing, an object of the present invention is to provide a semiconductor device which has a sufficient durability against the destruction and can protect an internal element. Another aspect of the present invention is to provide a method for manufacturing such a semiconductor device.

The present invention provides, in a first aspect thereof, a semiconductor device comprising: a semiconductor substrate having a first conductivity-type; a first embedded layer having a second conductivity-type and formed in the semiconductor substrate; a second embedded layer having a second conductivity-type and formed in the semiconductor substrate, the first embedded layer having a depth larger than a depth of the second embedded layer; an internal bipolar transistor having an emitter, a base and a collector which is formed as the first embedded layer; and a protection bipolar transistor having an emitter, a base and a collector which is formed as the second embedded layer, the base and the emitter of the protection transistor being connected together. In the first aspect of the present invention, the first and the second embedded layers may be modified as long as current is likely to flow in the second embedded layer.

The present invention provides, in a second aspect thereof, a method for manufacturing a semiconductor device including the steps of: forming a first embedded layer having a second conductivity-type and a second embedded layer having the second conductivity-type overlying a semiconductor substrate having a first conductivity-type; forming heavily doped collector layers reaching to each of the first and the second embedded layers; forming intrinsic collector regions overlying each of the first and the second embedded layers such that an electric resistance of the intrinsic collector region overlying the first embedded layer is larger than that of the intrinsic collector region overlying the second embedded layer; forming an external base layer having the first conductivity-type and an intrinsic base layer having the first conductivity-type in each of the intrinsic collector regions; and forming an emitter layer having the second conductivity-type in the intrinsic base layer.

Although the bipolar transistor is employed as the protection element in the first and the second aspects of the present invention, a MOS transistor may be replaced therewith.

In accordance with the present invention in which the electric resistance between the collector and the emitter (in case of bipolar transistor) or between the source and the drain or between the source or the drain and the embedded layer (in case of MOS transistor) of the protection element is higher than that of the internal element to be protected, even if static electricity is generated in the circuit, the static electricity is discharged in the protection element having the lower electric resistance and the internal element is no longer damaged.

The sufficiently larger difference between the electric resistances of the protection element and the internal element can also avoid possible damages of the internal element generated due to variations of junction resistances depending on manufacturing and operating conditions.

The internal element is securely protected by preventing the generation of breakdown current without using an extremely thin emitter layer.

The above and other objects, features and advantages of the present invention will be more apparent from the following description.

BRIEF DESCRIPTION OF DRAWINGS

FIG. 4 is a vertical sectional view showing a semiconductor device in accordance with a first embodiment of the present invention.

FIGS. 5A and 5B are exemplified circuit diagrams employing the semiconductor device of FIG. 4.

PREFERRED EMBODIMENTS OF THE INVENTION

Figure 1:
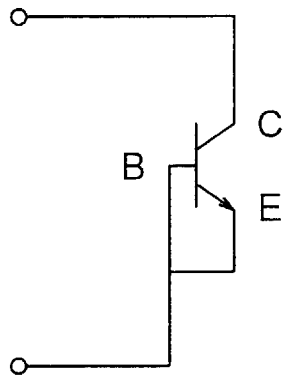
FIG. 1 is a circuit diagram showing an example of a conventional semiconductor device.
Figure 2:
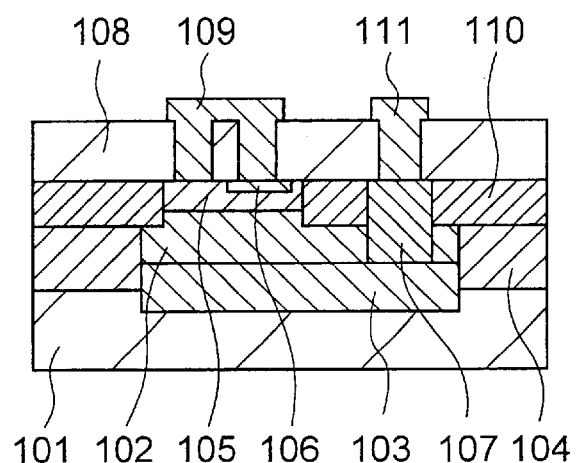
FIG. 2 is a vertical sectional view showing the circuit of FIG. 1.
Figure 3:
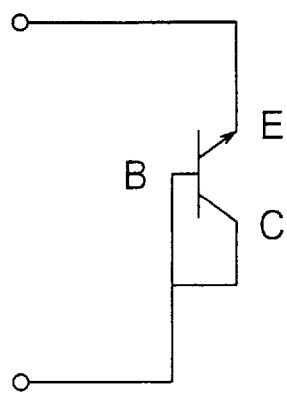
FIG. 3 is a circuit diagram showing another example of the conventional semiconductor device.

Now, the present invention is more specifically described with reference to accompanying drawings.

In a semiconductor device in accordance with a first embodiment shown in FIG. 4, a deep first embedded layer 12 and a shallow second embedded layer 13 overlie a P-type silicon substrate 11 wherein depths in connection with "deep" and "shallow" mean a height of the bottom surfaces of the both embedded layers. When the thicknesses of the both embedded layers are substantially the same, "deep" and "shallow" are determined depending on the height of the top surfaces of the both embedded layers. Since the bottom surface of the first embedded layer 12 is positioned lower than that of the second embedded layer 13 and the thicknesses of the both embedded layers are substantially the same, the top surface of the first embedded layer 12 is positioned lower than that of the second embedded layer 13.

Intrinsic collector regions 30 and 30a are formed on the first embedded layer 12 and the second embedded layer 13, respectively. The thickness of the intrinsic collector region 30 on the first embedded layer 12 is larger than that of the intrinsic collector region 30a on the second embedded layer 13 by the difference between the depths of the both embedded layers.

A P-type dielectric layer 14 is an isolation layer surrounding the side surface of the transistor. A field oxide film 15 connected with the P-type silicon substrate 11 and disposed on the P-type dielectric layer 14 is formed by selectively replacing the region other than the diffused layer with an oxide film.

In both of the intrinsic collector regions 30 and 30a, external base layers 17 and intrinsic base layers 18 both of which are P-type layers are formed, and emitter layers 20 are formed in the intrinsic base layers 18 by employing N-type polysilicon films 19 as a diffusion source.

A first dielectric film 21 separates the intrinsic base layer 18 from the N-type polysilicon films 19, and the emitter layer 20 is formed in a window of the intrinsic base layer 18.

N-type collector layers 16 having a high concentration are formed between the respective collector electrodes and the N-type embedded layers 12 and 13, and voltages are applied to the N-type embedded layer 12 and 13 through the N-type collector layers 16.

A second dielectric film 22 is formed on the first dielectric film 21 and the N-type polysilicon film 19, and the respective via holes are formed in the second dielectric film 22 corresponding to the external base layer 17, the N-type polysilicon film 19 and the collector layer 16.

An aluminum electrode 24 is disposed on the via holes, and a base electrode and an emitter electrode of the protection element are connected.

In circuit diagrams shown in FIGS. 5A and 5B, a symbol "Tr1" designates the internal transistor of FIG. 4, and a symbol "Tr2" designates the protection element of FIG. 4. The protection element Tr2 may be connected with either an input side (FIG. 5A) or an output side (FIG. 5B) of the circuit. In either case, the internal transistor Tr1 can be protected from static electricity.

Figure 6:
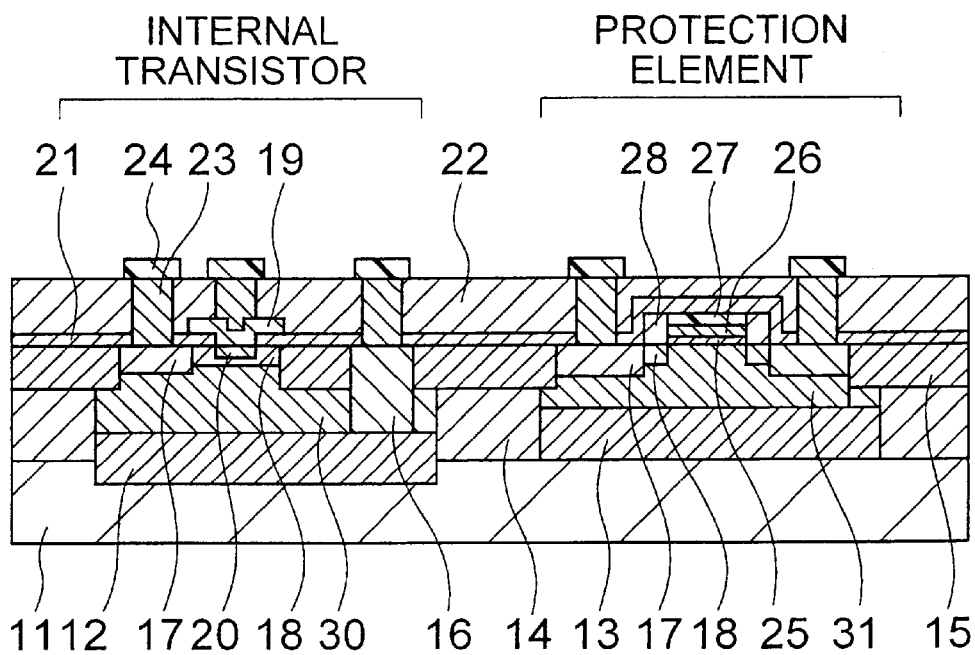
FIG. 6 is a vertical sectional view showing a semiconductor device in accordance with a second embodiment.

A semiconductor device in accordance with a second embodiment shown in FIG. 6 is an improvement of the first embodiment.

A P-channel MOS transistor 13 is disposed on the shallow second embedded layer 13 in place of the bipolar transistor. In FIG. 6, an N-well region 31 is formed in place of the intrinsic collector region 30a in the first embodiment shown in FIG. 4.

A field oxide film 15 is a region which is formed by selectively replacing the region other than the diffused layer with an oxide film. A P-type dielectric layer 14 formed under the field oxide film 15 is an isolation layer surrounding the side surface of the transistor and having a depth reaching to the surface of the silicon substrate 11.

On the other hand in the protection element, an external base layer 17 is a source-drain layer, and an intrinsic base layer 18 is an LLD layer.

A gate oxide film 25, a gate polysilicon film 26 and a high melting point metal film 27 are deposited in this turn on the N-well region 31, and the side surface of these films is surrounded by a side wall film 28. The first dielectric film 21 covers the top surfaces of the high melting point metal film 27 and the side wall film 28, and the second dielectric film 22 covers the first dielectric film 21 and the N-type polysilicon film 19. The respective via holes are formed in the first dielectric film 22 corresponding to the external base layer 17, the N-type polysilicon film 19, the collector layer 16 and the source-drain of the protection element.

In the first embodiment, the base-collector withstand voltage at which the protection element starts to operate is reduced by making the second bedded layer 13 shallow. In the second embodiment, a further reduction of the base-collector withstand voltage can be attained. When the thickness "L" of the gate of the P-channel MOS transistor is large, the drain-source withstand voltage is substantially the same as a breakdown voltage or the base-collector withstand voltage. However, the withstand voltage decreases with the thinning of the thickness "L" of the gate. Accordingly, the appropriate selection of the thickness "L" enables the further reduction of the voltage for starting the operation of the protection element.

Figures 7A, 7B:
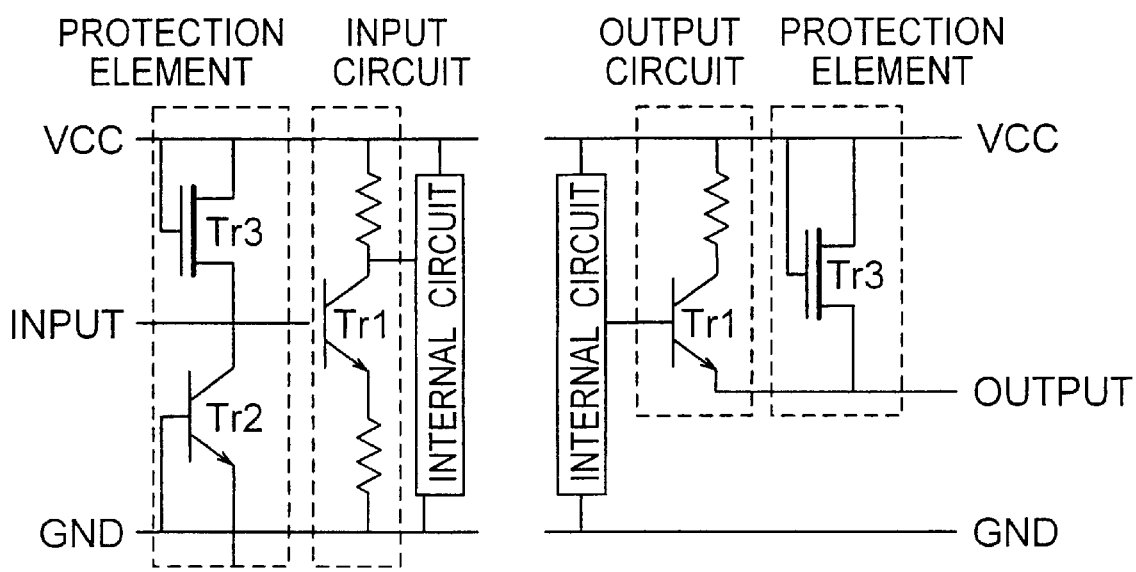
FIGS. 7A and 7B are exemplified circuit diagrams employing the semiconductor device of FIG. 6.

In circuit diagrams shown in FIGS. 7A and 7B, a symbol "Tr1" designates the internal transistor of FIG. 4, and a symbol "Tr3" designates the protection element of FIG. 6. The protection element Tr3 may be connected with either an input side (FIG. 7A) or an output side (FIG. 7B) of the circuit. In either case, the internal transistor Tr1 can be protected from static electricity.

Then, a method for manufacturing the semiconductor device of the first embodiment will be exemplified.

Figure 8:
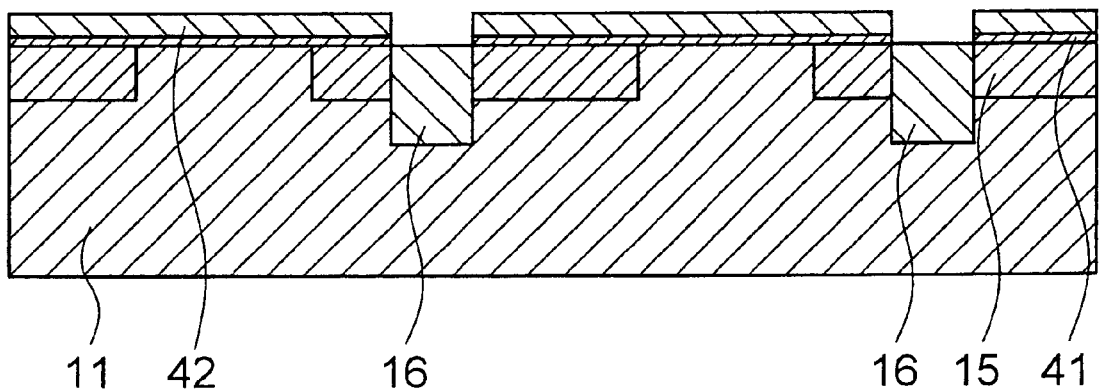
FIG. 8 is a vertical sectional view of a semiconductor wafer showing a first stage of a series of stages for manufacturing the semiconductor device of FIG. 4.

The field oxide film 15 having a thickness of 400 to 600 nm for separating diffused layers is formed on the P-type silicon substrate 11 by employing a selective oxidation technique. Then, a silicon oxide film 41 having a thickness of 20 to 40 nm and a silicon nitride film 42 having a thickness of 100 to 300 nm are formed in this turn on the oxide film 1.5. Then, the collector layers 16 having the high concentration are formed by forming windows reaching to the silicon substrate 11 where the collector layers 16 are to be formed and conducting phosphorous diffusion to the windows at 800 to 900° C. (FIG. 8).

Figure 9:
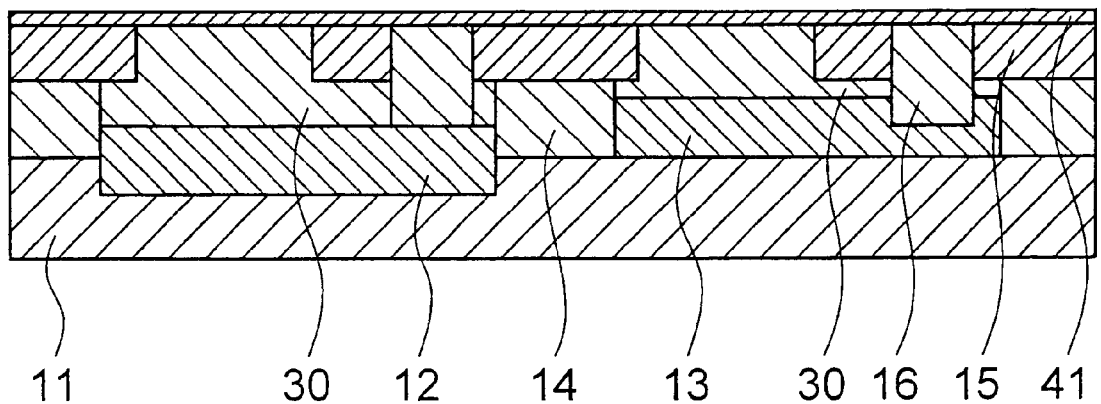
FIG. 9 is a vertical sectional view corresponding to FIG. 8 showing a second stage.

After the windows are oxidized, the silicon nitride film 42 is removed and the respective diffused layers are formed employing the photolithographic ion injection technique (FIG. 9).

The first deep N-type embedded layer 12 in FIG. 9 is formed by means of high energy ion injection of phosphorous at 1 to 15 MeV and a dosage between 2 and 8E13. The second shallow N-type embedded layer 13 is formed by means of high energy ion injection of phosphorous lower than that of the first embedded layer 12 at 700 to 900 KeV and a dosage between 2 and 8E13. The intrinsic collector regions 30 are spontaneously formed by scattering of the phosphorous atoms distributed by collision with the P-type silicon substrate 11 during the formation of the first and the second N-type embedded layers 12 and 13.

The P-type dielectric layer 14 is formed by means of twice boron ion injections at 200 to 400 KeV and a dosage between 2 and 6E13 and at 80 to 150 KeV and a dosage between 1 and 5E12.

After the silicon oxide film 41 is removed, the silicon oxide film as the first dielectric film 21 having a thickness of 150 to 300 nm is formed and the respective diffused layers are formed employing the photolithographic ion injection technique.

Figure 10:
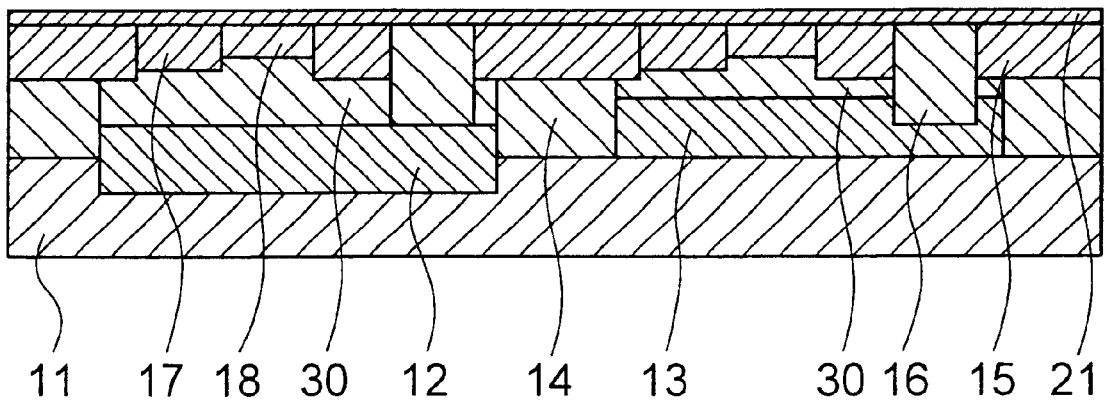
FIG. 10 is a vertical sectional view corresponding to FIG. 8 showing a third stage.

The external base layer 17 is formed by means of boron ion injections at 50 to 100 KeV and a dosage between 1 and 5E15. The intrinsic base layer 18 is formed by means of boron ion injections at 50 to 100 KeV and a dosage between 1 and 3E13 (FIG. 10).

Figure 11:
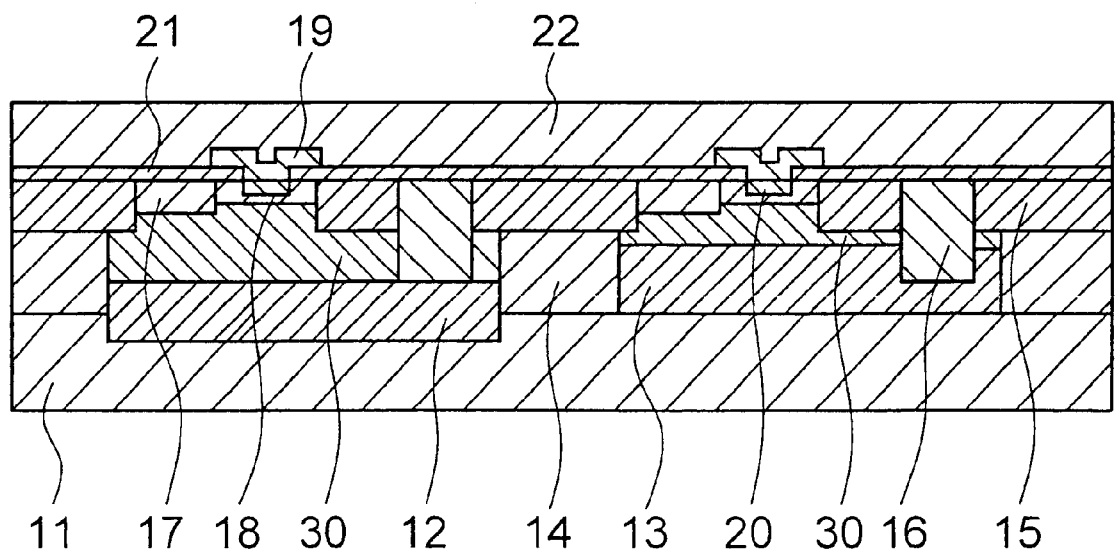
FIG. 11 is a vertical sectional view corresponding to FIG. 8 showing a fourth stage.

After the windows reaching to the intrinsic base layer 18 are formed in the first dielectric film 21, the N-type polysilicon film 19 having a thickness of 100 to 200 nm is formed. The emitter layer 20 is formed by means of thermal treatment at a temperature between 800 and 900° C. employing the N-type polysilicon film 19 as a diffusion source. Thereafter, a BPSG film as the second dielectric film 22 having a thickness of 800 to 1000 nm is formed and flattened by employing a known spin-on-glass film technique or a CMP technique (FIG. 11).

Then, the semiconductor device shown in FIG. 4 can be obtained by forming the via holes by a known technique, filing the via holes with a tungsten film 23 by a known technique and forming the aluminum film (electrode) 24 by a known technique.

Since the protection element of the semiconductor device of the first embodiment is the bipolar transistor and the depth of the second embedded layer of the protection element is shallower than that of the bipolar transistor of the internal element, or the interlayer distance between the embedded layer and the emitter layer of the protection layer is shorter than that of the internal element, static electricity entering the semiconductor device or generated therein is discharged through the protection element to protect the internal element. The larger difference between the interlayer distances can more effectively prevent the flowing of the static electricity into the internal element which may be caused by variation of the collector-emitter breakdown voltages of the both elements during the manufacture, and the destruction of the internal element associated therewith.

Figure 12:
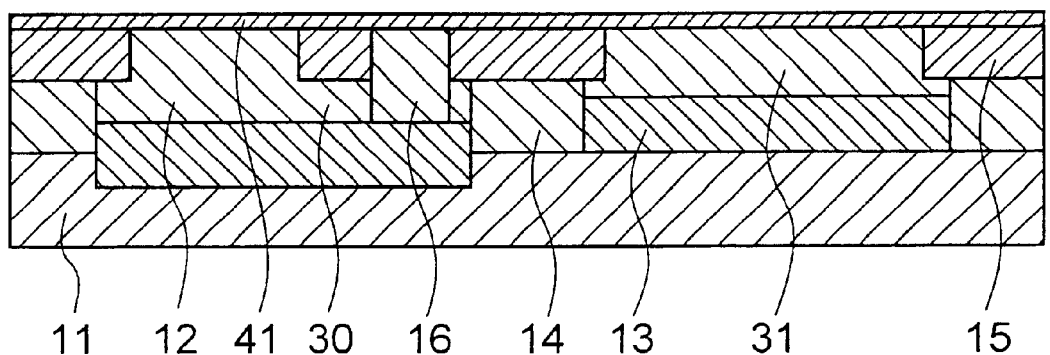
FIG. 12 is a vertical sectional view of a semiconductor wafer showing a first stage of a series of stages for manufacturing the semiconductor device of FIG. 6.
Figure 13:
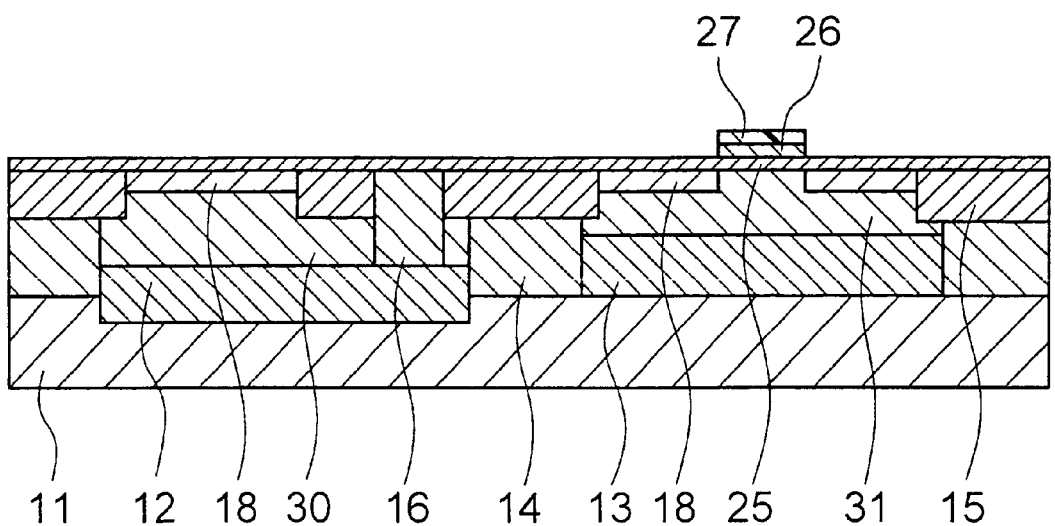
FIG. 13 is a vertical sectional view corresponding to FIG. 12 showing a second stage.

Then, a method for manufacturing the semiconductor device of the second embodiment will be exemplified referring to FIGS. 12 to 15. FIG. 12 corresponds to FIG. 9, but the collector layer having the high concentration is not formed in the protection element.

After the silicon oxide film 41 shown in FIG. 12 is removed, the gate oxide film 25 having a thickness of 6 to 10 nm is formed.

After the gate polysilicon film 26 having a thickness of 100 to 200 nm and a WSi film as the high melting point metal film 27 having a thickness of 100 to 200 nm are sequentially formed on the gate oxide film 25, the gate electrode is formed in the protection element by utilizing the photolithographic ion injection technique. Thereafter, the intrinsic base layer 18 (LLD layer in protection element) is formed by means of boron ion injection at 10 to 30 KeV and a dosage between 1 and 3E13.

Figure 14:
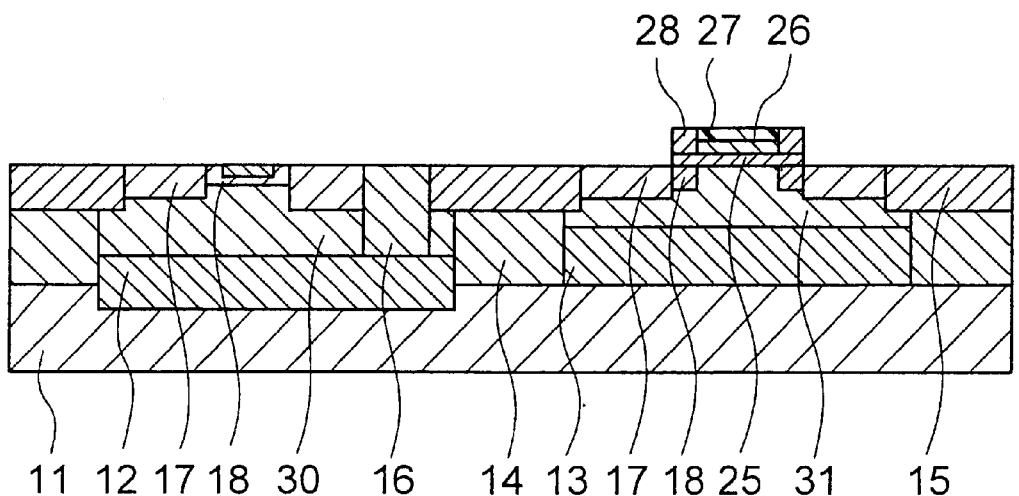
FIG. 14 is a vertical sectional view corresponding to FIG. 12 showing a third stage.

The silicon oxide film having a thickness of 100 to 200 nm is grown as the side wall film 28 which is converted into the gate electrode side wall. Then, the external base layer 17 (source-drain layer in protection element) is formed by means of the photolithographic technique and boron fluoride ion injection at 50 to 100 KeV and a dosage between 1 and 5E15 (FIG. 14).

Figure 15:
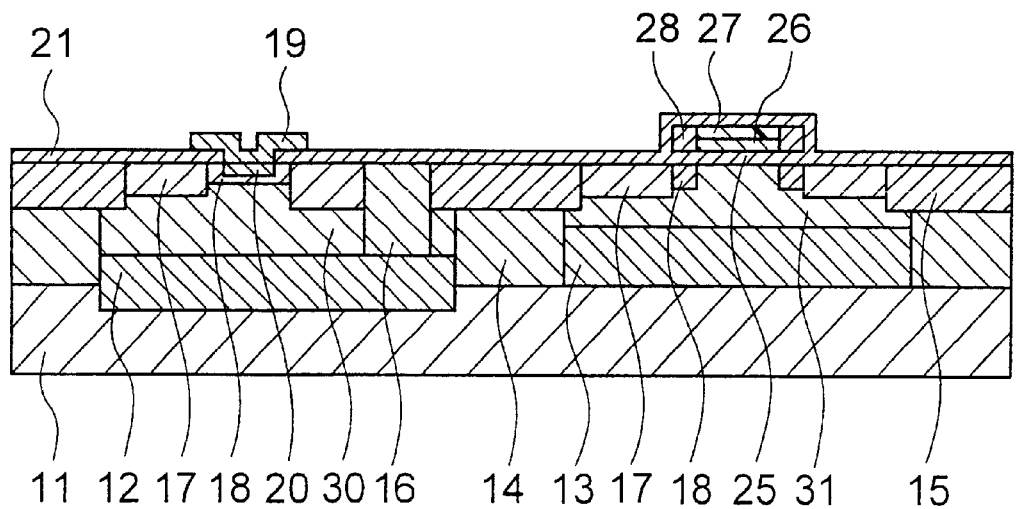
FIG. 15 is a vertical sectional view corresponding to FIG. 12 showing a fourth stage.

After the silicon oxide film having a thickness of 100 to 200 nm is formed as the first dielectric film 21 and the window reaching to the intrinsic base layer 18 is formed, the N-type polysilicon film 19 having a thickness of 100 to 200 nm is formed. The emitter layer 20 is formed by means of thermal treatment at a temperature between 800 and 900° C. employing the N-type polysilicon film 19 as a diffusion source (FIG. 15).

Thereafter, a BPSG film as the second dielectric film 22 having a thickness of 800 to 1000 nm is formed and flattened by employing a known spin-on-glass film technique or a CMP technique.

Then, the semiconductor device shown in FIG. 6 can be obtained by forming the via holes by a known technique, filing the via holes with a tungsten film 23 by a known technique and forming the aluminum film (electrode) 24 by a known technique.

The semiconductor device of the second embodiment includes the P-channel MOS transistor as the protection element, and the destruction of the internal element can be prevented similarly to the first embodiment.

As described, for protecting the internal element in the present invention, the depth of the embedded layer of the internal element is larger than that of the protection element, or the electric resistance between the embedded layer and the base layer or the emitter layer of the internal element (more accurately, the overall resistance from the base terminal to the collector terminal through the embedded layer, which is referred to as a collector saturation resistance) is lower than that of the protection element, or the interlayer distance of the internal element is larger than that of the protection element.

Although the static electricity in the semiconductor device acts as generating the breakdown of the base-collector junction, the base-collector withstand voltage increases with the increase of the distance from the base junction to the embedded layer. The reason thereof is as follows. A depleted layer more and more extends in the low-concentration intrinsic collector side with the increase of the reverse voltage, but when the depleted layer reaches to the embedded layer, the depleted layer hardly extends due to the high concentration to generate a strong electric field resulting in the occurrence of avalanche breakdown.

Accordingly, in the present invention, a conventional problem can be avoided that when the base-collector breakdown voltage of the internal element becomes lower than the base-collector breakdown voltage of the bipolar transistor protection element, the discharge starts earlier in the internal element to be destroyed than in the protection element, because the base-collector breakdown voltage of the protection element is lower than that of the internal element. Another conventional problem can be also avoided that the elements are destroyed due to the breakdown, because the current path by the bipolar operation becomes a main path rather than the breakdown current path, and accordingly, the emitter-base junction can be made shallower for responding to the rapidity of the operation.

In case of employing the MOS transistor as the protection element, when the source-drain distance (or source-drain resistance) is small (for example, several micrometers), the current easily flows in the source-drain junction and the MOS transistor functions as the protection element for internal element. Accordingly, the MOS transistor having the smaller source-drain distance is preferably selected.

Since the above embodiments are described only for examples, the present invention is not limited to the above embodiments and various modifications or alternations can be easily made therefrom by those skilled in the art without departing from the scope of the present invention.

What is claimed is:

1. A semiconductor device comprising: a semiconductor substrate having a first conductivity-type; a first embedded layer having a second conductivity-type and formed in the semiconductor substrate; a second embedded layer having a second conductivity-type and formed contacting the semiconductor substrate, the first embedded layer having a top surface depth larger than a top surface depth of the second embedded layer; an internal bipolar transistor having an emitter, a base and a collector which is formed on the top surface of the first embedded layer; and a protection bipolar transistor having an emitter, a base and a collector which is formed on the top surface of the second embedded layer, the base and the emitter of the protection transistor being connected together.

2. A semiconductor device comprising: a semiconductor substrate having a first conductivity-type; a first embedded layer having a second conductivity-type and formed in the semiconductor substrate; a second embedded layer having a second conductivity-type and formed contacting the semiconductor substrate, the first embedded layer having a top surface depth larger than a top surface depth of the second embedded layer; an internal bipolar transistor having an emitter, a base and a collector which is formed on the top surface of the first embedded layer; and a protection MOS transistor overlying the second embedded layer.

3. A semiconductor device comprising: a semiconductor substrate having a first conductivity-type; a first embedded layer having a second conductivity-type and formed in the semiconductor substrate; a second embedded layer having a second conductivity-type and formed in contact with the semiconductor substrate, the first embedded layer being electrically insulated from the second embedded layer; an internal bipolar transistor having an emitter, a base and a collector which is formed on a top surface of the first embedded layer; and a protection bipolar transistor having an emitter, a base and a collector which is formed on a top surface of the second embedded layer, the internal bipolar transistor having a collector saturated resistance having a resistance higher than a collector saturation resistance of the protection bipolar transistor, the top surface of the first embedded layer being positioned lower than the top surface of the second embedded layer.

4. A semiconductor device comprising: a semiconductor substrate having a first conductivity-type; a first embedded layer having a second conductivity-type and formed in contact with the semiconductor substrate; a second embedded layer having a second conductivity-type and formed in contact with the semiconductor substrate, the first embedded layer being electrically insulated from the second embedded layer; an internal bipolar transistor having an emitter, a base and a collector which is formed on a top surface of the first embedded layer; and a protection MOS transistor having overlying a top surface of the second embedded layer, the internal bipolar transistor having a collector-base breakdown voltage higher than a source-drain breakdown voltage of the protection MOS transistor, the top surface of the first embedded layer being positioned lower than the top surface of the second embedded layer.

5. A semiconductor device comprising: a semiconductor substrate having a first conductivity-type; a first embedded layer having a second conductivity-type and formed in contact with the semiconductor substrate; a second embedded layer having a second conductivity-type and formed in contact with the semiconductor substrate, the first embedded layer being electrically insulated from the second embedded layer; an internal bipolar transistor having an emitter, a base and a collector which is formed on a top surface of the first embedded layer; and a protection bipolar transistor having an emitter, a base and a collector which is formed on a top surface of the second embedded layer, a vertical distance between the top surface of the first embedded layer and a bottom surface of a base of the internal bipolar transistor is larger than a vertical distance between the top surface of the second embedded layer and a bottom surface of a base of the protection bipolar transistor, the top surfaces of the first and second embedded layers being below the bottom surfaces of the bases.

6. The device of claim 1, wherein the top surface of the first embedded layer is a single planar surface and the top surface of the second embedded layer is a single planar surface.

7. The device of claim 1, wherein the first and second embedded layers have a constant, equal thickness.

8. The device of claim 2, wherein the top surface of the first embedded layer is a single planar surface and the top surface of the second embedded layer is a single planar surface.

9. The device of claim 2, wherein the first and second embedded layers have a constant, equal thickness.

10. The device of claim 3, wherein the top surface of the first embedded layer is a single planar surface and the top surface of the second embedded layer is a single planar surface.

11. The device of claim 3, wherein the first and second embedded layers have a constant, equal thickness.

12. The device of claim 4, wherein the top surface of the first embedded layer is a single planar surface and the top surface of the second embedded layer is a single planar surface.

13. The device of claim 4, wherein the first and second embedded layers have a constant, equal thickness.

14. The device of claim 5, wherein the top surface of the first embedded layer is a single planar surface and the top surface of the second embedded layer is a single planar surface.

15. The device of claim 5, wherein the first and second embedded layers have a constant, equal thickness.

* * * * *